(12) United States Patent
Chen et al.

(10) Patent No.: US 9,386,680 B2
(45) Date of Patent: Jul. 5, 2016

(54) DETECTING PLASMA ARCS BY MONITORING RF REFLECTED POWER IN A PLASMA PROCESSING CHAMBER

(71) Applicant: Applied Materials, Inc., Santa Clara, CA (US)

(72) Inventors: Jian J. Chen, Fremont, CA (US); Shilpa Sudhakaran, Santa Clara, CA (US); Mohamad A. Ayoub, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/496,093

(22) Filed: Sep. 25, 2014

(65) Prior Publication Data

US 2016/0095196 A1 Mar. 31, 2016

(51) Int. Cl.
*H01L 21/306* (2006.01)
*H05H 1/46* (2006.01)

(52) U.S. Cl.
CPC ...................................... *H05H 1/46* (2013.01)

(58) Field of Classification Search
USPC ......................... 315/39, 39.3, 111.71, 111.21; 156/345.25, 345.26, 345.27, 345.28, 156/345.29; 438/14
See application file for complete search history.

(56) References Cited

U.S. PATENT DOCUMENTS

| | | | |
|---|---|---|---|
| 5,625,328 A | 4/1997 | Coleman, Jr. | |
| 5,629,653 A | 5/1997 | Stimson | |
| 5,643,364 A | 7/1997 | Zhao et al. | |
| 7,305,311 B2 | 12/2007 | van Zyl | |
| 7,640,120 B2 | 12/2009 | Axenbeck et al. | |
| 7,755,451 B2 | 7/2010 | Krausse et al. | |
| 2003/0215373 A1 | 11/2003 | Reyzelman et al. | |
| 2006/0049831 A1 | 3/2006 | Anwar et al. | |
| 2008/0036554 A1 | 2/2008 | Krausse et al. | |
| 2008/0156632 A1 | 7/2008 | Van Zyl | |
| 2010/0026415 A1 | 2/2010 | Mann et al. | |
| 2010/0174420 A1 | 7/2010 | Van Zyl | |
| 2010/0270141 A1 | 10/2010 | Carter et al. | |
| 2010/0280618 A1* | 11/2010 | Jodaitis ................... A61F 2/442 623/17.16 |
| 2011/0009999 A1 | 1/2011 | Zhang et al. | |
| 2011/0032047 A1* | 2/2011 | Yuzurihara ....... H01J 37/32082 332/108 |
| 2014/0132355 A1 | 5/2014 | Dupuis | |
| 2014/0266492 A1* | 9/2014 | Radomski ................ H03H 7/40 333/17.3 |

OTHER PUBLICATIONS

International Search Report and Written Opinion for International Application No. PCT/US2015/042742 dated Nov. 6, 2015.

* cited by examiner

*Primary Examiner* — Minh D A
(74) *Attorney, Agent, or Firm* — Patterson & Sheridan, LLP

(57) ABSTRACT

Embodiments of the present disclosure generally relate to methods for detecting unstable plasma in a substrate processing chamber. In one embodiment, the method includes providing a forward power from a power source to the substrate processing chamber through a detection device, splitting the forward power passing through the detection device at a predetermined ratio to obtain a first value of the power to the substrate processing chamber, measuring a reflected power from the substrate processing chamber to obtain a second value of the power from the substrate processing chamber, and directing the power source to turn off the forward power if the second value of the power is different than the first value of the power.

18 Claims, 3 Drawing Sheets

DETECTING PLASMA ARCS BY MONITORING RF REFLECTED POWER IN A PLASMA PROCESSING CHAMBER

BACKGROUND

1. Field

Embodiments of the present disclosure generally relate to methods of measuring reflected power from a plasma chamber using a directional coupler.

2. Description of the Related Art

In RF plasma processing systems, RF power is typically coupled into the plasma that is present in the reactor chamber through a match circuit which contains variable reactance elements. The purpose of the match circuit is to transform the impedance of the load (i.e., the plasma) to a value that equals or matches the characteristic impedance of the transmission line through which the RF power is delivered to the reactor chamber. At the match point, optimum power is delivered into the plasma and zero (or near zero) power is reflected back toward the RF generator.

However, the impedance of the load tends to vary during processing of the substrate, due to fluctuations of the plasma in the reactor chamber. In case of unstable plasma, such as arcing, a fast interruption or spike will occur in RF voltage and RF current and cause the impedance of the load to change abruptly, which in turn causes a spike in the RF power reflected back to the RF generator and therefore an RF impedance mismatch. As RF impedance mismatch occurs, the amount of RF power that is reflected back to the RF generator increases, while the amount of RF power delivered to the plasma decreases. Such fluctuations change the plasma conditions and therefore affect the plasma processing of the substrate, making it difficult to control process parameters such as etch rate or deposition rate.

Therefore, improved arc detection apparatus and methods are needed to monitor RF power reflected back from the reactor chamber for better plasma processing of the substrate.

SUMMARY

Embodiments of the present disclosure generally relate to apparatus and methods for detecting unstable plasma in a substrate processing chamber. In one embodiment, the method includes providing a forward power from a power source to the substrate processing chamber through a detection device, splitting the forward power passing through the detection device at a predetermined ratio to obtain a first value of the power to the substrate processing chamber, measuring a reflected power from the substrate processing chamber to obtain a second value of the power from the substrate processing chamber, and directing the power source to turn off the forward power if the first value of the power is different than the second value of the power.

In another embodiment, the method includes providing a forward power from a power source to a plasma load through a transmission line, and monitoring power reflected from the plasma load by a detection device disposed between the power source and the plasma load, the detection device comprising a main line extending between an input port and a transmitted port, the input port receiving and transmitting the forward power from the power source to the transmitted port, and the transmitted port receiving and transmitting the forward power from the input port to the plasma load, and a coupled line extending between an isolated port and a coupled port, the coupled port transmitting a portion of the forward power from the input port to a first sensor and a first resistive load, and the isolated port receiving and transmitting the power reflected from the plasma load to a second sensor and a second resistive load, and controlling the power source to turn off the forward power if a second value of the power reflected from the plasma load measured by the second sensor is different than a first value of the forward power measured by the first sensor.

In yet another embodiment, a processing system is provided. The processing system includes a processing chamber defining a substrate processing region therein, a power source providing a forward power to the processing chamber through a transmission line, a matching network tuning plasma load impedance of the processing chamber to a characteristic impedance of the power source, and a directional coupler disposed between the power source and the matching network, the directional coupler comprising a main line extending between an input port and a transmitted port, wherein the input port receives and transmits the forward power from the power source to the transmitted port, and the transmitted port receives and transmits the forward power from the input port to the processing chamber, a coupled line extending between an isolated port and a coupled port, wherein the coupled port transmits a portion of the forward power from the input port to a first sensor and a first resistive load, and the isolated port receives and transmits the power reflected from the processing chamber to a second sensor and a second resistive load, and a control device controls the power source to turn off the forward power based on a predetermined condition. The predetermined condition may comprise a first value of the forward power measured by the first sensor is different than a second value of the power reflected from the processing chamber measured by the second sensor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
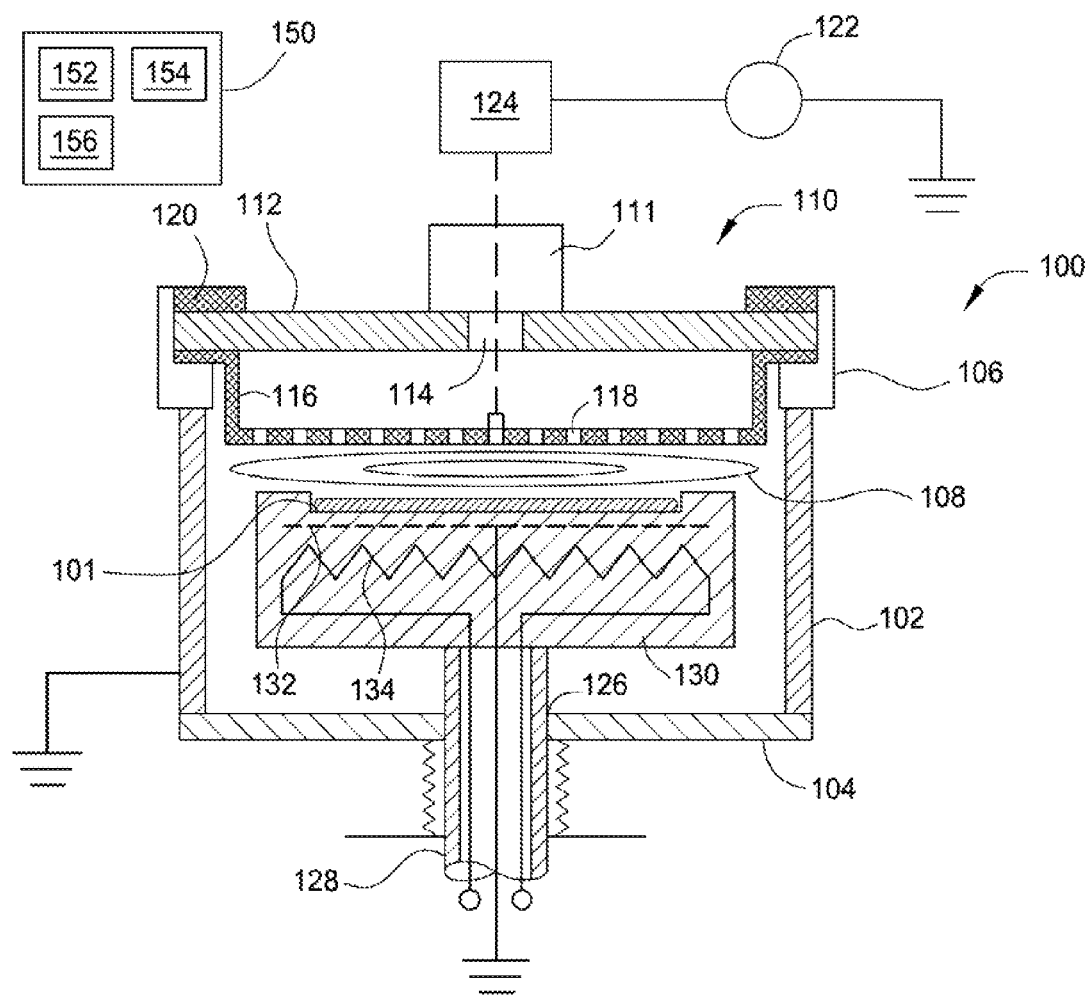
FIG. 1 is a schematic, cross-sectional view of an exemplary PECVD chamber on which embodiments of the present disclosure may be performed.

FIG. 1 is a schematic, cross-sectional view of an exemplary PECVD chamber 100 on which embodiments of the present disclosure may be performed. The PECVD chamber 100 includes sidewalls 102, a bottom wall 104, and a chamber lid 106, which cumulatively define a processing region 108. A gas distribution system 110 is disposed through the chamber lid 106 to deliver gases into the processing region 108. The gas distribution system 110 includes a gas box 112 with a gas inlet 114 that receives processing gases from a precursor source 111 and that introduces processing gases into the gas box 112. The gas distribution system 110 also includes a showerhead 116 having a plurality of gas passages 118 for distributing the processing gases from the gas box 112 into the processing region 108. The gas distribution system 110 may also include a gas box heater 120, such as a ring-shaped, resistive heater, to heat processing gases to a desired temperature.

The showerhead 116 is coupled to an RF power supply 122 to provide electrical energy to the showerhead 116 to facilitate plasma formation in the processing region 108. Thus, the showerhead 116 acts as an upper, powered electrode. An auto-tuned RF matching network 124 is positioned between the RF power supply 122 and the showerhead 116. In one embodiment, the RF power is supplied at an intermediate frequency of about 10-30 MHz, for example 13.56 MHz. In some embodiments, the RF power is supplied at a low frequency at or below about 20 MHz, for example about 100 kHz to about 20 MHz. In some embodiments, the RF power is supplied at a very high frequency (VHF) above 50 MHz, for example about 60 MHz to about 200 MHz.

The bottom wall 104 defines a passage 126 for a stem 128 that supports a pedestal heater 130. The pedestal heater 130 is configured to support a substrate 101 in the processing region 108. The pedestal heater 130 includes a ground mesh 132 embedded therein, which is coupled to an RF ground. Thus, the ground mesh 132 acts as a ground electrode to facilitate plasma formation in the processing region 108 between the showerhead 116 and the pedestal heater 130. The pedestal heater 130 also includes one or more heating elements 134, such as resistive heating elements, to heat the substrate 101 to a desired processing temperature.

A control system 150 including a central processing unit (CPU) 152, a memory 154, and support circuits 156, is coupled to the various components of the chamber 100 to facilitate control of processing within the chamber 100. The memory 154 can be any computer-readable medium, such as random access memory (RAM), read only memory (ROM), floppy disk, hard disk, or any other form of digital storage, local or remote to the chamber 100 or CPU 152. The support circuits 156 are coupled to the CPU 152 for supporting the CPU 152 in a conventional manner. These circuits include cache, power supplies, clock circuits, input/output circuitry and subsystem, and the like. A software routine or a series of program instructions store in the memory 154, when executed by the CPU 152, causes the chamber 100 to perform plasma processes therein.

Deposition chambers that may benefit from the present disclosure include chambers configured to deposit oxides, such as carbon-doped silicon oxides, silicon containing films, and other dielectric materials including advanced patterned films (APF). An example of a deposition chamber is the PRODUCER® chamber available from Applied Materials, Inc. of Santa Clara, Calif. The PRODUCER® chamber is a PECVD chamber with two isolated processing regions that may be used to deposit carbon-doped silicon oxides and other materials. Further details of an exemplary chamber useful for the present disclosure is described in U.S. Pat. No. 5,855,681. Although the chamber 100 is schematically depicted as a PECVD chamber, use of the subject matter of the present disclosure may be equally affective on other chambers, such as plasma etch or PVD chambers.

Figure 2:
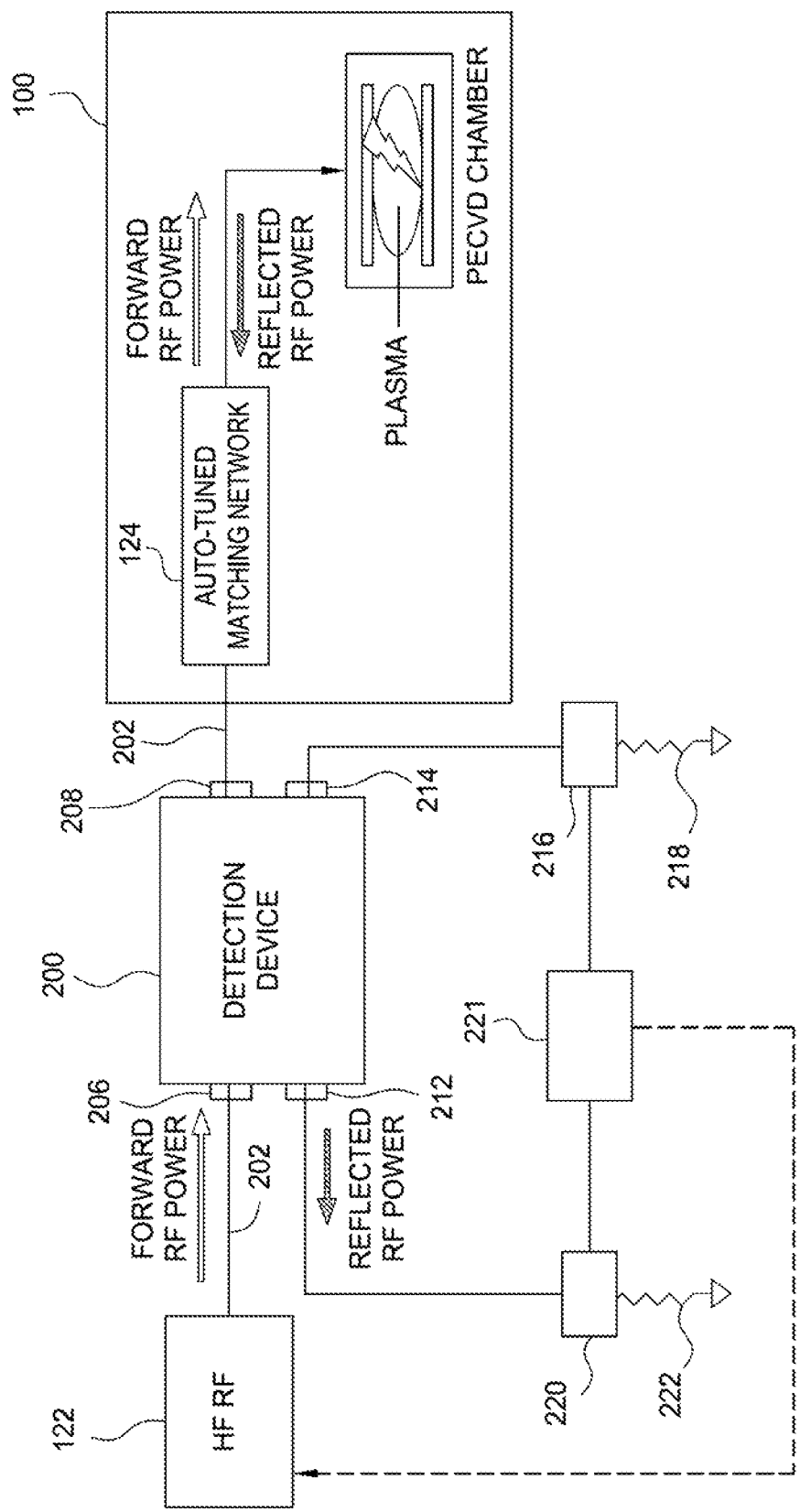
FIG. 2 is a schematic, block diagram of a detection device used to monitor reflected RF power from the PECVD chamber according to embodiments of the present disclosure.

FIG. 2 is a schematic, block diagram of a detection device 200 used to monitor reflected RF power from the PECVD chamber 100 according to embodiments of the present disclosure. While the PECVD chamber 100 of FIG. 1 is shown in a simplified form and discussed, the PECVD chamber 100 may be replaced with any suitable process chamber that utilizes plasma to perform a desired process on the substrate, such as plasma etching, plasma-enhanced chemical vapor deposition, or sputtering. The RF power supply 122 is connected to the PECVD chamber 100 through the detection device 200. The RF power supply 122 supplies RF forward power through a transmission line 202 and an auto-tuned RF matching network 124 to the electrode of the PECVD chamber 100, such as the showerhead 116 as shown in FIG. 1. The detection device 200 may function to decouple signals related to the RF forward power, which is the power provided by the RF power supply 122, and the reflected RF power, which is the power reflected by the plasma load (i.e., the PECVD chamber 100). In most cases, the detection device 200 is disposed externally to the PECVD chamber 100 and an RF power supply 122. For example, the detection device 200 may be disposed between the PECVD chamber 100 and the RF power supply 122. In some embodiments, the detection device 200 may be disposed internally inside the RF power supply 122. In some embodiments, the detection device 200 may be disposed internally inside the auto-tuned RF matching network 124.

The transmission line 202 may be a coaxial cable having a characteristic impedance of 50 ohms. The RF power supply 122 may be an RF generator having a source or internal impedance of 50 ohms. Different impedance for the transmission line and the RF generator is contemplated. The RF power supply 122 may supply the RF power at a frequency of about 100 kHz to about 200 MHz. For example, the RF power supply 122 may supply the RF power at an intermediate frequency of about 10-30 MHz, for example 13.56 MHz, or at a low frequency at or below about 20 MHz, for example about 100 kHz to about 20 MHz, or at a very high frequency (VHF) above 50 MHz, for example about 60 MHz to about 200 MHz. In one embodiment, the RF power supply 122 i a 13.56 MHz RF generator. If desired, the RF power supply may have two or more RF generators operating at different frequencies as discussed herein. The RF power supply 122 may include an output device (not shown), which matches the non-standard output impedance of the RF power source to the industry standard characteristic impedance of the coaxial cable of 50 ohms, for example.

Ideally, the net combined impedance "$Z'_L$" (i.e., plasma load impedance "$Z_L$" and auto-tuned RF matching network's impedance "$Z_{match}$") is equal to the characteristic impedance of source impedance (i.e., RF power supply's internal impedance "$Z_s$"), that is, $Z'_L = Z_L + Z_{match} = Z_s$. Under such a circumstance, the transmission line is matched to the load and source impedances and no power reflections occur in the transmission line 202. Under normal conditions, however, impedance mismatching exists in the characteristic impedance of the transmission lines, source impedance, and/or load impedance due mainly to plasma excursions (such as arcing) which result in abrupt change in plasma load impedance "$Z_L$". Therefore, $Z'_L = Z_L + Z_{match} \neq Z_s$. Unwanted power reflections also occur when the characteristic impedance of the transmission line is not matched to the load and source impedances. As a result, the plasma processing of the substrate is negatively affected. In order to promptly detect plasma excursions and identify undesired plasma excursions, the detection device 200 can be disposed at any desired point in the transmission line 202 between the RF power supply 122 and the PECVD chamber 100, for example between the auto-tuned matching network 124 and the RF power supply 122. The detection device 200 may be a directional coupler, a directional wattmeter, or any suitable component having a function similar to the directional coupler or wattmeter. For example, the detection device 200 may be a component capable of monitoring the reflected RF power from the PECVD chamber 100 by measuring the RF voltage, RF current, and/or their relative phase. In one embodiment, the detection device 200 is a directional coupler.

The detection device 200 may include a plurality of conductor lines coupling to the transmission line 202 to transmit the RF forward power and/or RF reflected power. In one embodiment, the detection device 200 may include an input port 206 configured to receive and transmit the RF forward power from the RF power supply 122, a coupled port 214 configured to transmit a portion of the RF forward power from the input port 206 to a sensor 216 and a resistive load 218, and a transmitted port 208 configured to receive and transmit the RF forward power from the input port 206, less the portion that went to the coupled port 214, to the PECVD chamber 100. The detection device 200 may also include an isolated port 212 configured to receive and transmit the RF power reflected from the plasma load to a sensor 220 and a resistive load 222. The RF power reflected from the plasma load goes through the detection device 200 backwardly via the transmitted port 208 to the isolated port 212. The detection device 200 may provide a control device 221 connecting to the sensor 216 and the sensor 220. The control device 221 controls the RF power supply 122 and thus the RF forward power provided by the RF power supply 122 based on the measured powers from the sensors 216, 220, as will be discussed in more detail in FIG. 3.

Figure 3:
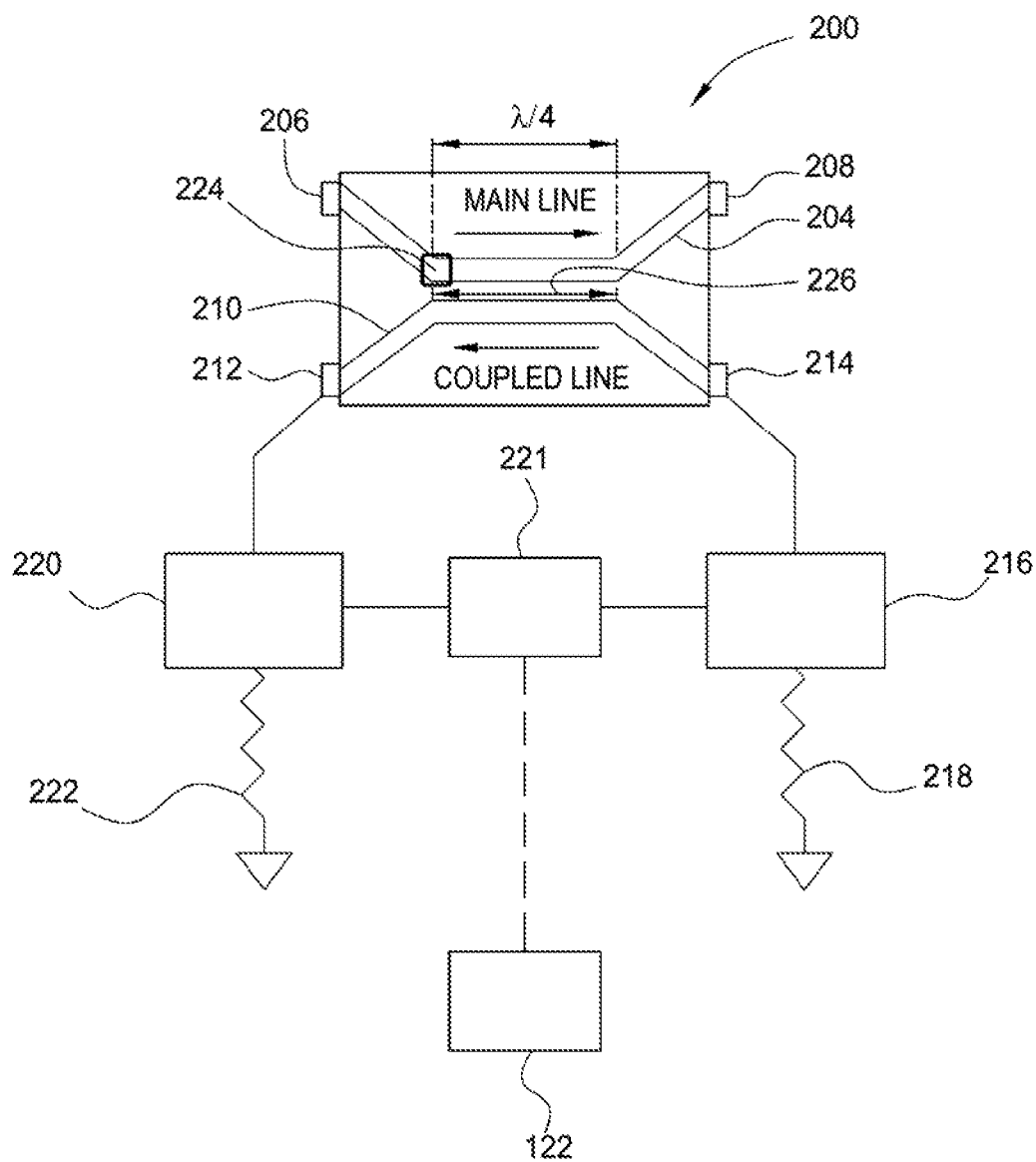
FIG. 3 depicts a schematic configuration of the detection device according to embodiments of the present disclosure.

FIG. 3 depicts a schematic configuration of the detection device 200 according to embodiments of the present disclosure. In some embodiments, the detection device 200 may include a main line 204 extending between the input port 206 and the transmitted port 208, and a coupled line 210 extending between the isolated port 212 and the coupled port 214. The use of two separate conductor lines (i.e., the main line 204 and the coupled line 210) allows the forward RF power and the reflected RF power to be measured decoupled from one another. As discussed above, the input port 206 is configured to receive and transmit the RF forward power from the RF power supply 122 to the transmitted port 208. The transmitted port 208 is configured to receive and transmit the RF forward power from the input port 206 to the plasma load (i.e., the PECVD chamber 100) through the auto-tuned RF matching network 124 (not shown, see FIG. 2). The coupled port 214 is configured to transmit a portion of the RF forward power from the input port 206 to the sensor 216 and the resistive load 218. The detection device 200 may include a power divider 224 or the like to equally split the RF forward power from the RF power supply 122 so that half of the RF forward power is transmitted to the transmitted port 208 and another half of the RF forward power is transmitted to the coupled port 214. The isolated port 212 is configured to receive and transmit the RF power reflected from the plasma load to the sensor 220 and the resistive load 222. While a 50-to-50% split ratio is discussed herein, any other split ratio is also contemplated depending upon the application. For example, about 20% to about 95% of the RF forward power received at input port 206 may be transmitted to the transmitted port 208 and the rest of the RF forward power is transmitted to the coupled port 214.

The RF forward power and the reflected RF power can be decoupled from the transmission line 202 with different coupling factors. Different coupling factors can be realized by positioning and coupling the main line 204 and the coupled line 210 at different separations from the transmission line 202. As the coupling factors are also influenced by the length and width of the conductor lines (i.e., the main line 204 and the coupled line 210), and the width and the length of the transmission line 202, the coupling factors can be adjusted by disposing the transmission line 202, the main line 204, and the coupled line 210 in different planes. In some embodiments, the main line 204 and the coupled line 210 may be offset from each other to create a coupling area 226, which reduces or prevents coupling between the main line 204 and the coupled line 210 and therefore reduces or prevents errors in the measurement results. If desired, multiple coupling areas or sections may be used. In some embodiments, certain portions of the main line 204 may be bent outside of the coupling area 226. In the coupling area 226, the main line 204 may extend in parallel to the transmission line 202 (not shown, see FIG. 2). Similarly, in some embodiments certain portions of the coupled line 210 may be bent outside of the coupling area 226. In the coupling area 226, the coupled line 210 may extend in parallel to the transmission line 202.

The coupled port 214 is directly or indirectly connected to the sensor 216, which can be a power meter, a voltage/current (V/I) sensor, or the like. The sensor 216 is connected to the resistive load 218 which may have a load resistance that matches the real output impedance of the RF generator. In one embodiment, the resistive load 218 has a load resistance of 50 ohms. The sensor 216 is used to sense and measure the split RF forward power passing through the coupled port 214. Particularly, the resistive load 218 serves to absorb any power reflections produced by circuits and/or measurement so that no new power reflections are produced that can potentially cause measurement errors at the other conductor line, for example the coupled line 210. Accordingly, the detection device 200 can measure the RF forward power more precisely because the impact of undesired reflections on the measurements is reduced or eliminated. Similarly, the isolated port 212 is directly or indirectly connected to the sensor 220, which can be a power meter, a voltage/current (V/I) sensor, or the like. The sensor 220 is connected to the resistive load 222 which may have a load resistance that matches the plasma load impedance and auto-tuned RF matching network's impedance. In one embodiment, the resistive load 222 has a load resistance of 50 ohms. The sensor 220 is used to sense and measure a portion of the power reflected from the plasma load passing through the isolated port 212. The sensor 220 may measure the reflected power at a sampling time of about 100 nanoseconds to about 0.5 second, such as between about 10 nanoseconds and about 0.2 second, for example about 50 microseconds to about 0.1 second. As will be discussed in more details below, the sensor 220 serves as a reference meter, which compares the measured reflected RF power with the split RF forward power measured by the sensor 216 to determine if the RF power supply 122 needs to turn off its power due to undesired plasma excursions in the PECVD chamber. The resistive load 222 serves to absorb any power reflections produced by circuits and/or measurement so that no new power reflections are produced that can potentially cause measurement errors at the other conductor line, for example the main line 204. Accordingly, the detection device 200 can measure the RF reflected power more precisely because the impact of undesired reflections on the measurements is reduced or eliminated. In some embodiments, the load resistance of the resistive loads 218, 222 may correspond within a suitable tolerance (less than ±10%, for example less than ±5%) to the characteristic impedance of the conductor lines (i.e., the main line 204 and the coupled line 210).

The length of the main line 204 and the coupled line 210 in the coupling area 226 generally has a length of approximately a quarter of a wavelength ($\lambda/4$). In some embodiments, the length of the main line 204 and the coupled line 210 in the coupling area 226 may be less than λ/4. In some embodiments, the length of the main line 204 and the coupled line 210 in the coupling area 226 may be less than λ/8. In some embodiments, the length of the main line 204 and the coupled line 210 in the coupling area 226 may be less than λ/10. The dimensions of the detection device 200 may be kept relatively small by controlling the length of the main line 204 and the coupled line 210. In addition, the coupling between the main line 204 and the coupled line 210 due to electrical and magnetic fields can be minimized if the main line 204 and the coupled line 210 in the coupling area 226 are relatively short, for example less than λ/4.

In operation, the RF power supply 122 (having an internal impedance "$Z_s$" of pure 50 ohms resistance, for example) delivers an RF forward power via the transmission line 202 (having a characteristic impedance "$Z_o$" of 50 ohms, for example) to the detection device 200, the auto-tuned RF matching network 124, and to the PECVD chamber 100 to form a plasma between upper and lower electrodes. The characteristic impedance of the transmission line 202 is matched with the internal impedance of the RF power supply 122, i.e., $Z_s=Z_o$, in order to have all the forward power passing through the interface between the output of the RF power supply and the transmission line without any power reflected back. The RF forward power passes through the input port 206 and equally splits into the transmitted port 208 through the main line 204 and into the coupled port 214 through the coupled line 210 via coupling. The split RF forward power is measured by the sensor 216 to obtain a first value of the RF power (i.e., RF forward power). The split RF forward power is then terminated at the resistive load 218, which has a load resistance of 50 ohms, for example. Meanwhile, the auto-tuned RF matching network 124 dynamically tunes and matches the net combined impedance "$Z'_L$" to 50 ohm, i.e., the characteristic impedance "$Z_o$" of the transmission line. The voltage reflection coefficient is given by $$\Gamma = \frac{Z'_L - Z_O}{Z'_L + Z_O},$$

and the RF reflected power is given by $P_{ref}=\Gamma^2 \times P_{fwd}$, where $P_{fwd}$ is the RF forward power.

When the net combined impedance "$Z'_L$" and the characteristic impedance "$Z_o$" of the transmission line are tuned, the RF reflected power is near 0 W as indicated by $\Gamma=0$ and $P_{ref}=0$. In case of unstable plasma such as arcing, plasma load impedance "$Z_L$" is changed abruptly, which leads to severe mismatch ($Z'_L \neq Z_o$) since the net combined impedance "$Z'_L$" (i.e., plasma load impedance "$Z_L$" and auto-tuned RF matching network's impedance "$Z_{match}$") is not equal to the characteristic impedance of the transmission line "$Z_o$". When such a mismatch ($Z'_L \neq Z_o$) occurs, those mechanically motor-driven capacitors in the auto-tuned matching network 124 may not respond as quickly as an arc. As a result, a small fraction of the RF power (e.g., 0.1%) reflected from the plasma load will go through the detection device 200 backwardly as indicated by $\Gamma \neq 0$ and $P_{ref}>0$. The RF reflected power passes through the transmitted port 208 to the isolated port 212 through the coupled line 210 via coupling. The RF reflected power is measured by the sensor 220 to obtain a second value of the RF power (i.e., RF reflected power). The RF reflected power may be measured and monitored about every 100 nanoseconds to about 0.5 seconds, such as about every 10 nanoseconds to about every 0.5 second, for example about every 50 microseconds to about every 0.1 second. The RF reflected power is then terminated at the resistive load 218, which has a load resistance of 50 ohms.

During operation, the control device 221 controls the RF power supply 122 by comparing the second value (i.e., the RF reflected power) to a threshold value, which can be an absolute power value, or a relative ratio of the first value (i.e., the split RF forward power), or a ramping rate (i.e., the amount of change of the RF power reflected power divided by the time for the change). If the second value is different than the threshold value, the control device 221 will immediately send a control signal to the RF power supply 122 to turn off its RF power. As the sensor 220 measures the RF reflected power at a high frequency sampling rate, the control device 221 can direct the RF power supply 122 to shut off RF forward power instantaneously at the same moment of detecting the first reflected power spike exceeding the threshold value, thereby preventing further damage to the substrate and the chamber hardware. Various predetermined conditions may trigger the shutting off of the RF power supply. For example, the control device 221 may cause the RF power supply 122 to shut off the RF forward power if the second value (i.e., the RF reflected power) is larger than zero Watt, or if the second value is larger than a spike level, e.g., 50 Watts. In some embodiments, the control device 221 may direct the RF power supply 122 to shut off the RF forward power if the second value exceeds a predetermined percentage of tolerance for critical damage to the substrate or chamber hardware, for example about 1% to about 10%, such as about 5%. Additionally or alternatively, the control device 221 may cause the RF power supply 122 to shut off the RF forward power if the second value exceeds a suitable percentage of tolerance (as discussed above) a predetermined number of times, for example about 2-4 times. It has been observed that the detection device 200 is able to detect any spike in the RF reflected power due to an arc as fast as about 10 nanoseconds to about 0.5 second, without any miss or false alarm.

Benefits of the present disclosure include the ability of detecting real arcs in real time with no miss and no false alarm by using a detection device disposed between the plasma chamber and an RF power supply. The detection device is in the form of a directional coupler, which connects to a control device that compares and determines if the split RF forward power (from the RF power supply) measured at the coupled port of the direction coupler and the RF reflected power (from the plasma chamber) measured at the isolated port of the direction coupler are different from each other, or are different from each other by a predetermined percentage of tolerance for critical damage to the substrate or chamber hardware, or are different from predetermined threshold value, either absolute or relative ratio, or ramping rate. The control device can direct the RF power supply to immediately shut off RF forward power as soon as measured power difference exceeding predetermined threshold value is detected, thereby preventing further damage to the substrate and the chamber hardware. In addition, while disclosed in an embodiment shown in FIG. 2, the detection device 200 along with sensors 216 and 220, resistive loads 218 and 222, and control device 221, are disposed externally between the auto-tuned RF matching network and an RF power supply, it can be understood that they can be re-packaged and integrated either with the RF power supply or with the auto-tuned RF matching network without departing the basic scope of this disclosure. One can benefit from the above integration in terms of compact sizes and costs.

While the foregoing is directed to embodiments of the present disclosure, other and further embodiments of the disclosure may be devised without departing from the basic scope thereof, and the scope thereof is determined by the claims that follow.

What is claimed is:

1. A method for detecting unstable plasma in a substrate processing chamber, comprising:
   providing a forward power from a power source to a plasma load through a detection device disposed between the power source and the plasma load;
   splitting the forward power passing through the detection device at a 50-to-50% split ratio to obtain a first value of the power to the plasma load;
   measuring a reflected power from the plasma load by the detection device at sampling time of about nanoseconds to about 0.5 second to obtain a second value of the power from the plasma load; and
   directing the power source to turn off the forward power based on a predetermined condition.

2. The method of claim 1, wherein the predetermined condition comprises the second value of the power is different than the first value of the power.

3. The method of claim 1, wherein the predetermined condition comprises the second value of the power is larger than zero Watt.

4. The method of claim 1, wherein the predetermined condition comprises the second value of the power is larger than a threshold value that is either an absolute power value, a relative ratio of the first value, or a ramping rate.

5. The method of claim 1, wherein the detection device is a directional coupler or a directional wattmeter.

6. The method of claim 1, wherein the detection device is disposed external to the power source and the substrate processing chamber.

7. The method of claim 1, wherein the detection device is disposed internally inside the power source or internally inside auto-tuned RF matching network.

8. A method for detecting unstable plasma in a substrate processing chamber, comprising:
   providing a forward power from a power source to a plasma load through a transmission line; and
   monitoring power reflected from the plasma load by a detection device disposed between the power source and the plasma load, the detection device comprising:
      a main line extending between an input port and a transmitted port, the input port receiving and transmitting the forward power from the power source to the transmitted port, and the transmitted port receiving and transmitting the forward power from the input port to the plasma load; and
      a coupled line extending between an isolated port and a coupled port, the coupled port transmitting a portion of the forward power from the input port to a first sensor and a first resistive load, and the isolated port receiving and transmitting the power reflected from the plasma load to a second sensor and a second resistive load; and
   controlling the power source to turn off the forward power if a second value of the power reflected from the plasma load measured by the second sensor is different than a first value of the forward power measured by the first sensor.

9. The method of claim 8, further comprising:
   splitting the forward power at the main line into the transmitted port and the coupled port at a predetermined ratio.

10. The method of claim 9, wherein the predetermined ratio is a 50-to-50% split ratio.

11. The method of claim 8, wherein the main line and the coupled line are offset from each other to define a coupling area.

12. The method of claim 11, wherein the main line and the coupled line are extended in parallel to the transmission line in the coupling area.

13. The method of claim 11, wherein the main line and the coupled line each has a length of approximately a quarter of a wavelength or less in the coupling area.

14. The method of claim 8, wherein controlling the power source to turn off the forward power further comprises if the second value is larger than a threshold value that is either an absolute power value, or a relative ratio of the first value, or a ramping rate.

15. The substrate processing system of claim 14, wherein the second value of the power reflected from the plasma load is provided about every 100 nanoseconds to about every 0.5 second.

16. A processing system, comprising:
   a processing chamber defining a substrate processing region therein;
   a power source providing a forward power to the processing chamber through a transmission line;
   a matching network tuning plasma load impedance of the processing chamber to a characteristic impedance of the power source; and
   a directional coupler disposed between the power source and the matching network, the directional coupler comprising:
      a main line extending between an input port and a transmitted port, wherein the input port receives and transmits the forward power from the power source to the transmitted port, and the transmitted port receives and transmits the forward power from the input port to the processing chamber;
      a coupled line extending between an isolated port and a coupled port, wherein the coupled port transmits a portion of the forward power from the input port to a first sensor and a first resistive load, and the isolated port receives and transmits the power reflected from the processing chamber to a second sensor and a second resistive load; and
      a control device controls the power source to turn off the forward power based on a predetermined condition.

17. The processing system of claim 16, wherein the directional coupler further comprises a power divider disposed at the main line to split the forward power into the transmitted port and the coupled port at a predetermined ratio.

18. The processing system of claim 16, wherein the predetermined condition comprises a second value of the power reflected from the processing chamber measured by the second sensor is different than a first value of the forward power measured by the first sensor.

* * * * *